United States Patent [19]
Nakashima et al.

[11] Patent Number: 5,665,613
[45] Date of Patent: Sep. 9, 1997

[54] METHOD OF MAKING SEMICONDUCTOR DEVICE HAVING SIMOX STRUCTURE

[75] Inventors: Sadao Nakashima; Katsutoshi Izumi, both of Tokyo; Norihiko Ohwada, Musashino; Tatsuhiko Katayama, Hiratsuka, all of Japan

[73] Assignees: Komatsu Electronic Metals Co., Ltd., Kanagawa; Nippon Telegraph and Telephone Corporation; NTT Electronics Technology Corporation, both of Tokyo, all of Japan

[21] Appl. No.: 458,507

[22] Filed: Jun. 2, 1995

[30] Foreign Application Priority Data

Jun. 3, 1994 [JP] Japan .................................. 6-145486

[51] Int. Cl.$^6$ ........................................ H01L 21/76
[52] U.S. Cl. ........................ 438/151; 438/165; 438/404; 438/981
[58] Field of Search ..................... 437/24, 26, 62, 437/979, 41, 40; 148/DIG. 163; 257/501

[56] References Cited

U.S. PATENT DOCUMENTS

| | | |
|---|---|---|
| 4,749,660 | 6/1988 | Short et al. . |
| 4,975,126 | 12/1990 | Margail et al. . |
| 5,399,507 | 3/1995 | Sun . |
| 5,488,004 | 1/1996 | Yang . |

FOREIGN PATENT DOCUMENTS

| | | |
|---|---|---|
| 0570057 | 11/1993 | European Pat. Off. . |
| 0675534 | 3/1995 | European Pat. Off. . |
| 2180540 | 11/1973 | France . |
| 5568651 | 5/1980 | Japan . |
| 60144950 | 7/1985 | Japan . |
| 61185950 | 8/1986 | Japan . |
| 4102317 | 4/1992 | Japan . |
| 4264724 | 9/1992 | Japan . |

OTHER PUBLICATIONS

J. Stoemenos, et al., "New Conditions for Synthesizing SOI Structures by High Dose Oxygen Implantation", Journal of Crystal Growth, 73 (1985) 546–550.

C. Jaussaud, et al., "Defects in SIMOX Structures: Causes and Solutions", Vacuum, vol. 42, Nos. 5/6, pp.341–347, 1991.

P.L.F. Hemment, et al., "Ion Beam Synthesis of Thin Buried Layers of SiO$_2$ in Silicon", Vacuum, vol. 36, Nos. 11/12, pp. 877–881, 1986.

P.L.F. Hemment, et al., "Nucleation and Growth of SiO$_2$ Precipitates in SOI/SIMOX Related Materials–Dependence Upon Damage and Atomic Oxygen Profiles", Nuclear Instruments and Methods in Physics Research, B39 (1989) 210–214.

(List continued on next page.)

Primary Examiner—George Fourson
Attorney, Agent, or Firm—McAulay Fisher Nissen Goldberg & Kiel, LLP

[57] ABSTRACT

A SIMOX substrate 1 is processed through high temperature oxidation treatment after forming a mask-pattern 3 to shield specified electrodes from oxidation in order to increase partly a thickness of a buffed oxide layer 2 to form an area 4. Next, after an oxide film is removed from the surface of the substrate and LOCOS separation is practiced, MOSFET is produced by fabricating a source S and a drain D on the area 4 or the buffed oxide layer 2. Since the buried oxide layer corresponding to electrodes parts influenced by disadvantages of parasitic capacitance are thickened, an operation speed of an inverter is not much decreased and since mean thickness of the buried oxide layer can be thinner, a decrease of a drain electric current by negative electrical resistance can be suppressed. Furthermore, since the thickness of the buffed oxide layer can be controlled in response to each device, plural devices having different breakdown voltages are formed together on the same substrate.

5 Claims, 7 Drawing Sheets

OTHER PUBLICATIONS

J. Stoemenos, et al., "SiO$_2$ buried Layer Formation by Subcritical Dose Oxygen Ion Implantation", Appl. Phys. Lett. 48(21), May 26, 1986, pp. 1470–1472.

J. Stoemenos, et al., "Nucleation and Growth of Oxide Precipitates in Silicon Implanted with Oxygen", Thin Solid Films, 135 (1986), 115–127.

IEEE Transaction on Electron Devices, Jan. 1966, USA, vol. ED–33, No. 1, ISSN 0018–9383, pp. 126–132, XP002012608–S. Nakashima, et al.–"High–Voltage CMOS SIMOX technology and its application to a BSH–LSI".

IBM Technical disclosure Bulletin, vol. 27, No. 11, April 1985, New York, USA, pp. 6703–6704, XP002012609–"Isolation Technique Using Oxygen Implantation".

1993 Symposium on VLSI Technology–Digest of Technical Papers (IEEE Cat. No. 93 CH 33303–5), Proceedings of IEEE VLSI Technology Symposium, Kyoto, Japan, 17–19 May 1993, Tokyo, Japan; Bus. Center for Acad. Soc. Japan, pp. 25–26, XP000462897–T. Ohno, et al.–"A high–performance ultra–thin quarter–micron CMOS/SIMOX Technology".

IBM Technical Disclosure Bulletin, vol. 36, No. 11, Nov. 1993, New York, USA, pp. 227–228, XP000462897–"Low–Dose SIMOX with Thin Buried Oxide".

METHOD OF MAKING SEMICONDUCTOR DEVICE HAVING SIMOX STRUCTURE

BACKGROUND OF THE INVENTION

1. Field of the Invention

This invention is related to a method of producing semiconductor devices and, more particularly, to a preferable method of production to form MOSLSI on an SIMOX substrate.

2. Description of the Related Art

In general, a semiconductor substrate having a top single-crystal silicon layer, where device elements are formed, and a dielectric ($SiO_2$) layer in a single-crystal silicon substrate is called as SOI (Silicon On Insulator) having two producing methods which are known well as a wafer bonding method and an oxygen ion implantation method. The former wafer bonding method is that the single-crystal silicon substrate is bonded on other single-crystal silicon substrate on which an oxide film is formed in advance and one of two single-crystal silicon substrates is polished to form a thin active silicon layer. The latter is called as SIMOX (Separation by IMplanted OXygen), in which high-dose oxygen ions ($^{16}O^+$) are implanted into the single-crystal silicon substrate and a high temperature anneal processing (1,100°–1,200° C.) is practiced to cause Si and O to react, so that a buried oxide layer is formed in the silicon substrate. The thus method has been notable as it has been favorable to form the thin active silicon layer for large-scale integration lately.

The SIMOX substrate has, right after the oxygen ion implantation, there are both of compound Si-O with an unstable combining state besides chemical stable $SiO_2$ in the SIMOX substrate right after the oxygen ion implantation, so that it has been said that a heat treatment at high temperatures, which is generally called as an anneal processing, after the ion implantation is required in order to form a dielectric layer having an abrupt interface. The above processing has a different way by ion implantation conditions, but in general, has the way in which the heat treatment is processed under an atmosphere containing therein 0.5–1.0% $O_2$ added to Ar gas as an inert gas in 1,100°–1,200° C. for several hours.

It is known that, in the thus SIMOX substrate, structure and quality of the buried oxide layer formed under the top silicon layer by implanting the oxygen ions into the single-crystal silicon substrate depend on an ion implanting quantity (dose of ions), so that the dose of oxygen ions as $10^{17}$–$10^{18}$/cm$^2$ is required in order to form the buried oxide layer having the abrupt interface. But, there is disadvantages of producing crystal defects in the top single-crystal silicon layer when the dose of ions is increased, and observing the relation of a crystal dislocation density and the dose of ions, when the dose of ions reaches over $1.0\times10^{18}$/cm$^2$, the dislocation density is increased and crystal quality of the top silicon layer where device elements are formed is inferior. When the dose of ions is controlled within the range between $0.5\times10^{18}$/cm$^2$ and less than $1.0\times10^{18}$/cm$^2$ in order not to produce the crystal defect, a breakdown electric field of the buried oxide layer is smaller and the breakdown voltage is decreased. Consequently, as a condition capable of obtaining the high breakdown electric field of the buried oxide layer and of achieving the low dislocation density in the top silicon layer, at an acceleration energy of 150–200 keV, for example, the ion implantation has been practiced by setting the dose of ions at around $0.4\times10^{18}$/cm$^2$ (J. Mater. Res., Vol. 8, No. 3, 1993 pp. 524–534).

Figure 5:
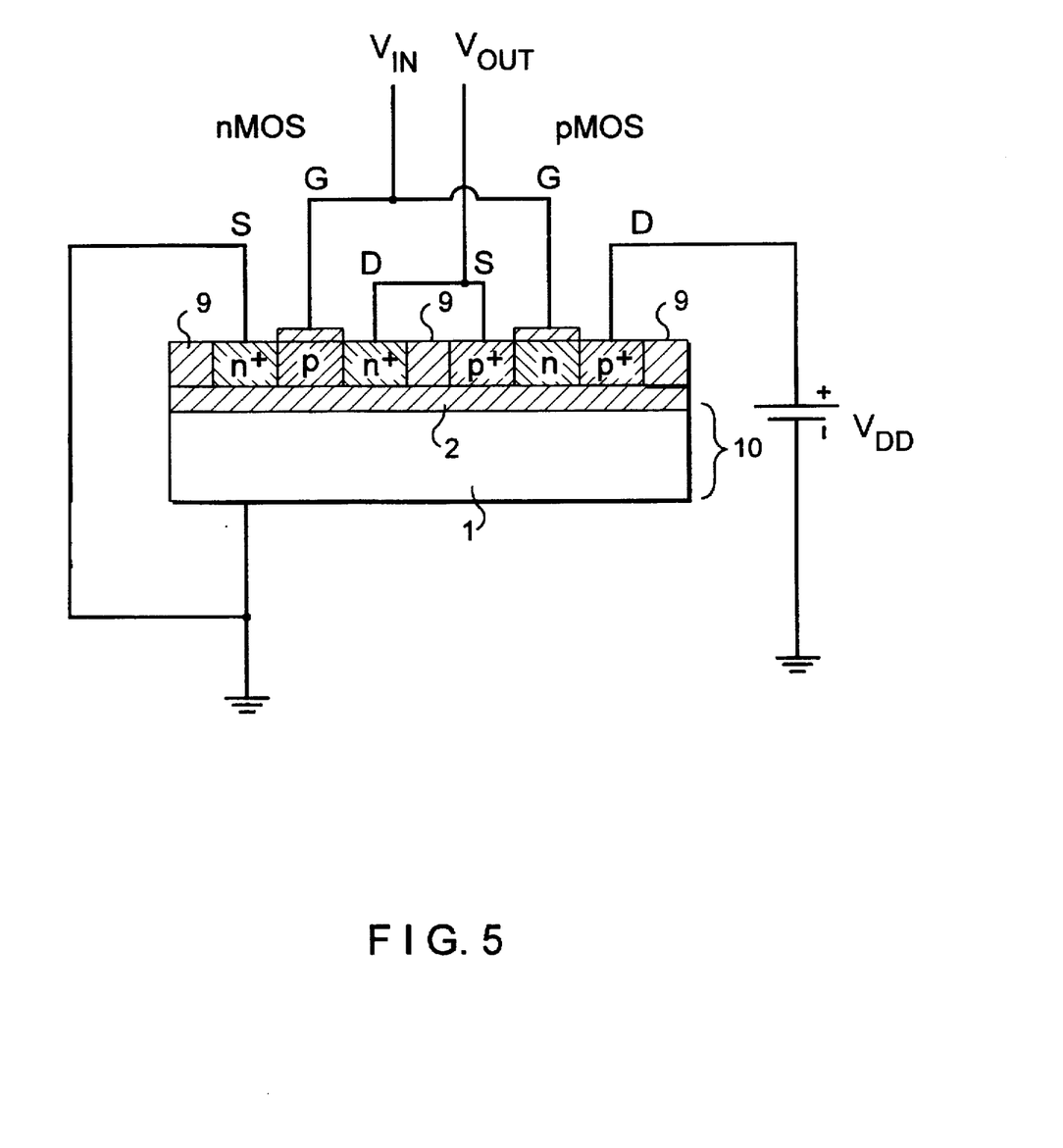
FIG. 5 is a schematic cross-sectional view of MOSFET.

An MOS device is formed in the above-described SIMOX substrate by doping impurity into the top silicon layer dielectrically separated by the buffed oxide layer from the substrate silicon and forming a source and a drain. FIG. 5 is a schematic cross-sectional view of a CMOS device designed as described above. In the drawing, a symbol S means the source, a symbol D means the drain, a symbol G means a gate and a symbol $V_{DD}$ means the applied voltage. MOS-type LSI produced by employing the SIMOX substrate, where forms therein the buried oxide layer by implanting the oxygen ions into the single-crystal silicon substrate and practicing the anneal processing, has following disadvantages.

First, the high quality SIMOX substrate is that the dislocation density of the top single-crystal silicon layer is low and an .electrically insulated state of the buried oxide layer is excellent. However, since the dose of ions is defined in low level in order to restrain generation of the crystal defects, the thickness of the buried oxide layer become thinned down 80–90 nm and parasitic capacitance between the drain and the substrate silicon in an nMOS and between the drain and source and the substrate in a pMOS is larger, with the result that there has been a weak point as an operation speed of inverter is decreased.

Second, when the thickness of the buffed oxide layer is adjusted to be increased by increasing the dose of ions in order to attain smaller parasitic capacitance in producing of the SIMOX substrate, heat resistance in a direction of the thickness of the buried oxide layer is increased and the temperature of the device goes up, with the result that there has been weak points that negative electrical resistance property of drain electric current is serious and that saturated drain electric current is more and more decreased. Furthermore, when the thickness of the buried oxide layer is defined as for example 450 nm, there has been a weak point that a short-channel effect of MOSFET is serious (see IEEE 1991 IEDM Tech. Dig., 1991 pp. 675–678) and production of small sized MOSFET become difficult.

Third, as described above, the buried oxide layer is thinned down 80–90 nm in the high quality SIMOX substrate in which the crystal dislocation density is low and the electrically insulated state of the buried oxide layer is excellent, so that it is a weak point that high-voltage devices such as IGBT (Insulated Gate Bipolar Transistors) can not be fabricated on the thus SIMOX substrate. Consequently, the high-voltage devices have been fabricated on the substrate having the thick buried oxide layer of the SOI substrate produced by the wafer bonding method and so on, so that it has been difficult that both of the high-voltage devices and the low-voltage devices are formed together on the high quality SIMOX substrate.

SUMMARY OF THE INVENTION

Considering the afore-mentioned conventional disadvantages, objects of the present invention are intended to, first, provide the method of producing the semiconductor devices capable of forming the devices to keep up the operation speed of the inverter. Second object is intended to provide the method of producing the semiconductor devices capable of restraining the drain electric current from decreasing by the negative electrical resistance. And third object is intended to provide the method of producing the semiconductor devices capable of forming all of devices having different breakdown voltages together on the same substrate, which are the usual low-voltage devices such as MOSFET of a self-align type employed at about an applied voltage of 5 V and the high-voltage devices such as IGBT, MOSFET of a stack-gate design type or MOSFET of an offset-gate type which are employed in use required over an applied voltage of 5 V.

It is preferable that the thickness of the buffed oxide layer is thickened in view of the operation speed of the inverter but is thinned in view of heat resistance, or a decrease of the drain electric current and a suppression of a short-channel effect of MOSFET. As the method of producing MOS semiconductor devices meeting the above-mentioned antithetic condition, the present invention is intended to form the MOS devices on thickened part of the buffed oxide layer by means of the high-temperature oxidation treatment after forming mask-pattern corresponding to each source and drain of the devices on the SIMOX substrate. Therefore, conventional disadvantages which are the decrease of the operation speed resulted from the parasitic capacitance and the decrease of the drain electric current by the negative electrical resistance will can be suppressed. And in further design of the present invention, since a buried oxide layer is possessed of different breakdown electric fields in response to devices having different breakdown voltages and corresponding to the mask-pattern on the SIMOX substrate in order to be able to form all of plural devices having different breakdown voltages on the same substrate, miniaturization of the device and a great decrease of the device cost will be achieved.

DETAILED DESCRIPTION OF THE PREFERRED EMBODIMENT(S)

Figure 6:
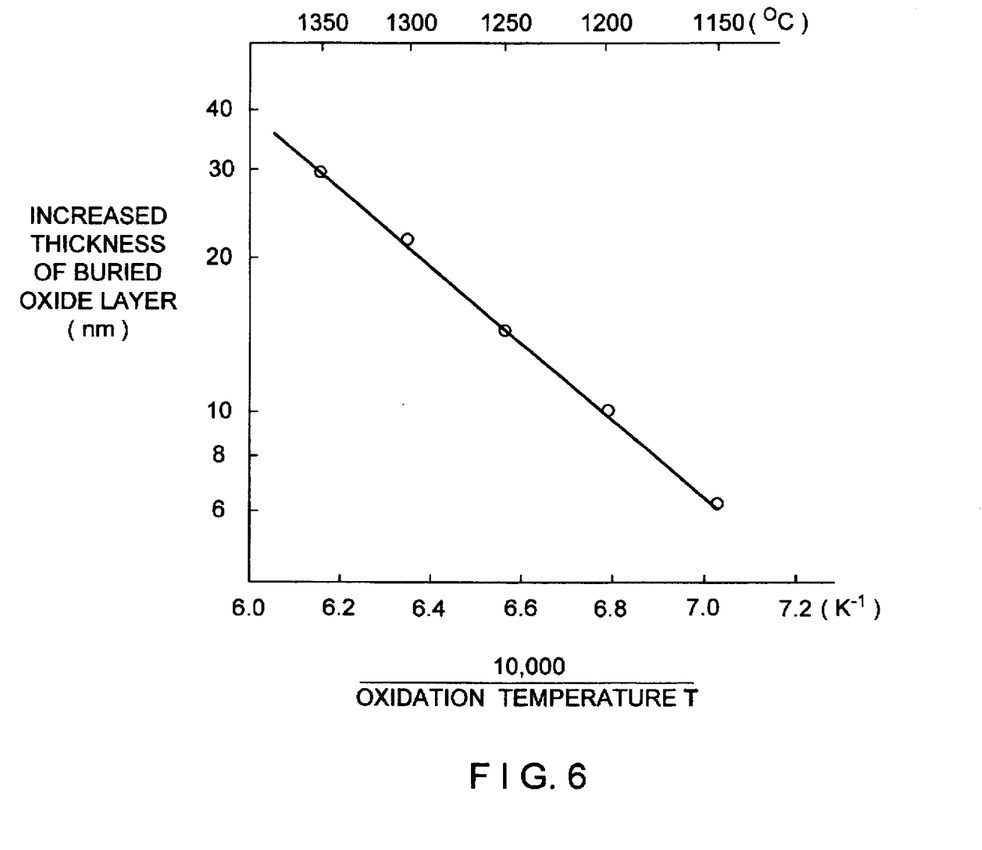
FIG. 6 is a correlative chart of the oxidation temperature and the increased thickness of the buried oxide layer in the case of an oxidation of about 180-nm-thick top single-crystal silicon layer in the high-temperature oxidation process.

The present invention attains the objects by recognizing two phenomena of which are, on condition that a buried oxide layer is preparedly formed in a SIMOX substrate therein through an anneal processing after an oxygen ion implantation, one phenomenon of a thickness increase of a buried oxide layer by a high-temperature oxidation treatment of the SIMOX substrate and the other phenomenon of a non-growth of the buried oxide layer by the high-temperature oxidation treatment of the SIMOX substrate after forming preparedly an oxidation shield mask on a top silicon layer of the SIMOX substrate. On condition that, in the SIMOX substrate, a thickness of the top silicon layer is 320 nm and a thickness of the buffed oxide layer is 89 nm, when such a SIMOX substrate is practiced in an oxidation treatment for four hours in an oxygen atmosphere at a flow rate of 70% $O_2$ in an inert gas at 1350° C., the phenomenon in which the thickness of the buried oxide layer is increased to 118 nm is recognized. Changing the temperature and oxidation time period, and surveying how the buried oxide layer increases in proportion to the changed respective oxidation temperatures under the definite condition to increase the top thermal oxide film to about 400 nm, as shown in FIG. 6, it is confirmed that the thickness of the buffed oxide layer is increased in proportion as the oxidation temperature is increased. The effect on increasing the thickness of the buried oxide layer is confirmed at over 1150° C.

Figure 7:
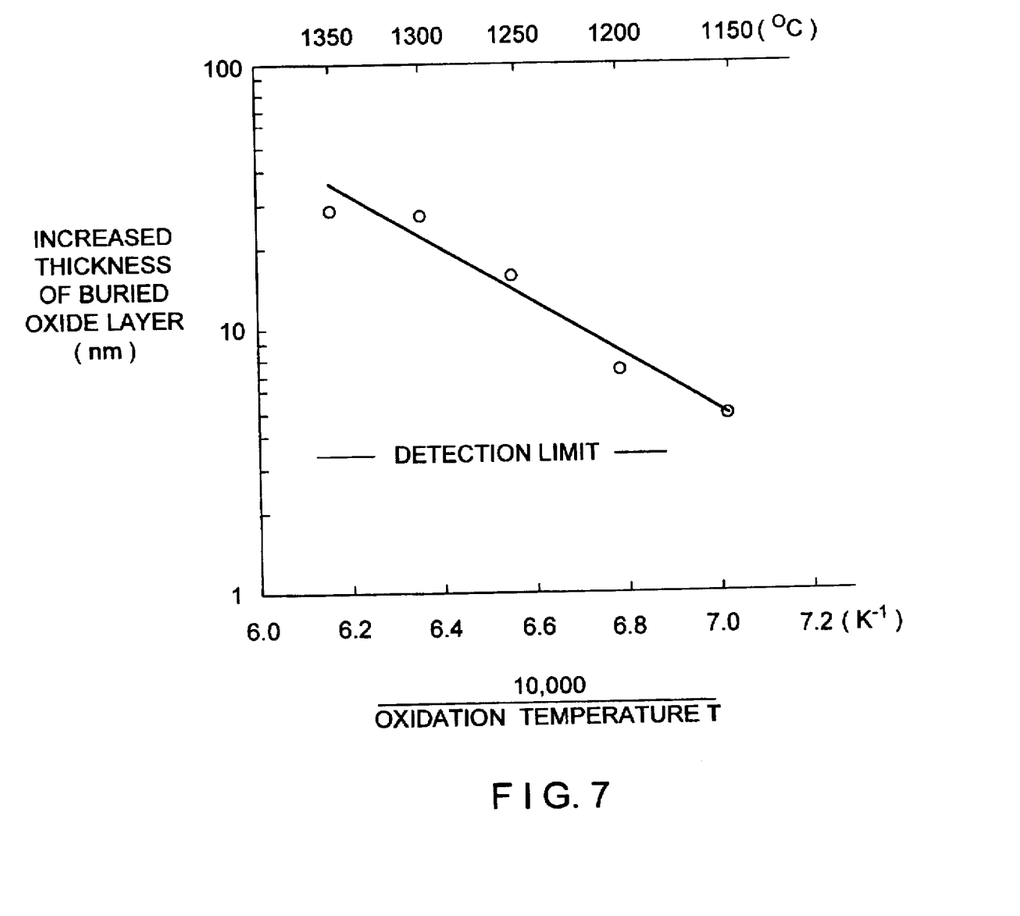
FIG. 7 is a correlative chart of the oxidation temperature and the increased thickness of the buried oxide layer in the case of defining the oxidation time period as four hours and an $O_2$ concentration of 70% in the high-temperature oxidation process.

Similarly, FIG. 7 charts a defined case when the oxidation time period is four hours and the $O_2$ concentration is 70%. In the above-mentioned figure, the oxidation temperature graduated on the horizontal axis is indicated by numerical values of $10^4$ times the reciprocal of the absolute temperature. And Celsius temperature is shown at the upper of the charts. As exemplified in the figure, the thickness of the buried oxide layer is increased in proportion as the oxidation temperature is increased. The buried oxide layer is not increased under the oxidation temperature 1100° C., and if the oxidation time period is defined as an utilitarian period, for example four hours, an effect on the growth in thickness can not be recognized because the increased thickness is below a detection limit. However, the thickness increase of the buried oxide layer is recognized about 30 nm when the oxidation temperature goes up at 1350° C. According to a conventional method, the thickness of the buffed oxide layer in a silicon substrate has been 80–90 nm, however, it can be confirmed that the thickness of the buried oxide layer is increased to 110–120 nm under the condition which the oxidation treatment is practiced at 1350° C. and the thickness of the top oxide film is defined as about 400 nm in accordance with the present invention. Therefore, the temperature condition is required at least over 1150° C. in order to obtain the effect on the thickness increase of the buried oxide layer, and the such temperature is the same as the anneal processing temperature. Incidentally, an upper limit temperature should be under the temperature which is 1415° C. as a melting point of silicon.

Figure 8:
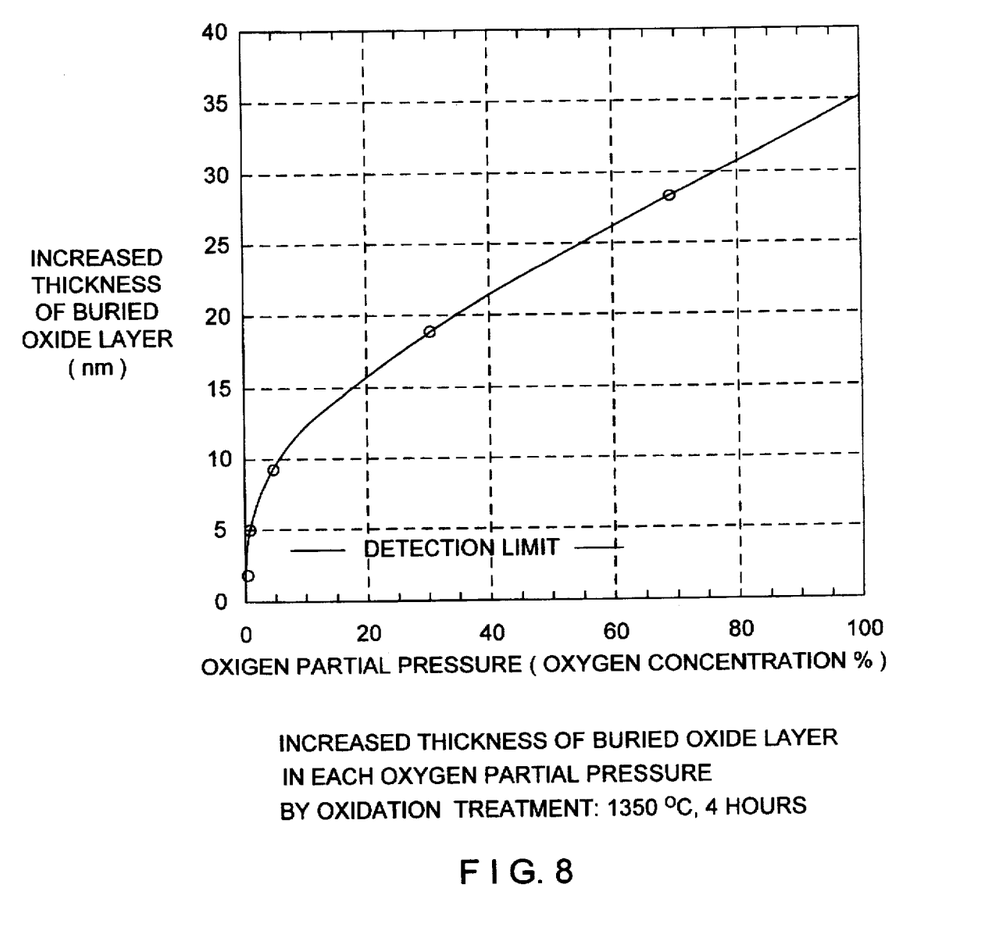
FIG. 8 is a correlative chart of the increased thickness of the buried oxide layer to the oxygen partial pressure in the high-temperature oxidation process.

As it can be considered that the high oxygen concentration in the oxygen atmosphere exercises basically an influence on the thickness increase of the buried oxide layer reaction, surveying experimentally how the increased thickness of the buried oxide layer according as an oxygen partial pressure is changed on the premise that the oxidation treatment is carried out for four hours at the temperature condition of 1350° C. after the anneal processing, a property line-chart as shown FIG. 8 can be obtained. According to the figure, there can be read as the effect on the thickness increase is obtained about over the $O_2$ concentration 1%, and the thickness increase is extremely few in the $O_2$ concentration 0.5% and because of irregularity on the interface between the buried oxide layer and the substrate silicon can not be discriminated, so that it is understood that the $O_2$ concentration over 0.5% can exert the effect on the thickness increase of the buried oxide layer. Because, since the temperature condition can be basically controlled as the main factor in order to diffuse the oxygen in the atmosphere to the inside of the SIMOX substrate from at least the top silicon layer or a substrate silicon layer and form a residence lamination of $SiO_2$ on the buried oxide layer, it can be thought that the above-shown $O_2$ concentration over 1% is required as the minimum concentration to diffuse into the silicon layer. It can be naturally understood from FIG. 8 that the thickness increase of the buried oxide layer is practiced by the oxygen concentration as a factor under the predetermined temperature.

On the other hand, the SIMOX substrate (on condition that the thickness of the top silicon layer is 320 nm, the thickness of the buried oxide layer is 89 nm) on which a silicon nitride film 100 nm as an oxygen shield mask is formed is treated for four hours in an oxygen atmosphere of 70% $O_2$ at 1350° C., but the thickness increase of the buried oxide layer can not be recognized.

Consequently, in the producing method for the semiconductor devices according to the present invention, when the buried oxide layer is formed through the anneal processing treated with high temperature in the inert gas atmosphere after completing an oxygen ion implantation to the single-crystal silicon substrate, and when the semiconductor devices are formed on the SIMOX substrate the top single-crystal silicon layer practiced in a dielectric separation by the buffed oxide layer, the oxidation shield mask is preparedly formed to meet the specified region of the semiconductor devices whereunder the top silicon layer in the SIMOX substrate is formed, and the buried oxide layer corresponding with other regions except the regions covered with the oxygen shield mask grows by practicing the high-temperature oxidation treatment to the SIMOX substrate over 1150° C. in oxygen atmosphere. And a source or a drain is formed on the top silicon layer whereunder the buried oxide layer has grown partly.

When the semiconductor device formed on the substrate is designed as nMOS, the drain region or the drain region and the source region are formed in other regions except the specified regions shielded by the afore-mentioned mask, and when the semiconductor device is designed as pMOS, both of the drain and the source may be formed in the top silicon layer corresponding to other regions except the specified regions shielded by the mask.

In this case, the temperature of the high-temperature oxidation treatment may be defined as between 1150° C. and less than the melting point temperature of the single-crystal silicon, and the high temperature oxidation treatment may be practiced in the oxygen gas atmosphere containing higher oxygen concentrations than those in the anneal processing. The high-temperature oxidation treatment can certainly realize the thickness increase of a buried oxide layer by practicing in the oxygen gas atmosphere containing over the oxygen concentration 1%.

In other instance, when the semiconductor devices are formed in the top single-crystal silicon layer under which the buried oxide layer is formed by carrying out the anneal processing with the high-temperature treatment in the inert gas atmosphere after practicing the oxygen ion implantation into the single-crystal silicon substrate, the oxidation shield masks are formed in advance to correspond to low-voltage devices forming portion of the plural semiconductor devices formed on the top silicon layer of the SIMOX substrate, and the growth of the buried oxide layer is partly practiced in the buried oxide layer region except the above-explained shield mask region by practicing the high-temperature oxidation treatment over 1150° C. in the oxygen atmosphere. Thereafter, a high-voltage device is formed in the top silicon layer on the thick film region of the buried oxide layer, and the low-voltage device is formed on the top silicon layer on the thin film region of the buried oxide layer, so that the devices having different breakdown voltages can be designed for a mixed integration on the same substrate.

Since the growth of the buried oxide layer can be partly practiced in the SIMOX substrate by the high-temperature oxidation, a breakdown voltage of the devices can be increased by means of the thickness increase of the buried oxide layer corresponding to the region where the high-voltage devices are formed. An exothermic disadvantages of the low-voltage device can be solved by releasing heat by means of avail of the thin buried oxide layer formed in the SIMOX substrate by the oxygen ion implantation. A difference of the breakdown voltage can be distinguished by the applied voltage, but it may be generally distinguished in a criterion of 5 V. As matter of course, the thickness of the buffed oxide layer can be controlled in plural steps with the required breakdown voltage, and by practicing plural treatments of the growth of the buffed oxide layer, the thickness of the buffed oxide layer can be controlled in response to each breakdown voltage sorted beyond the limit of the two breakdown voltages by the high-temperature oxidation.

As above stated, after the thickness of the buffed oxide layer is controlled in response to the devices having different breakdown voltages by the high-temperature oxidation, the oxidation shield mask is formed in advance to correspond to the buried oxide layer where the specified regions of the low-voltage devices are formed thereon, and after the growth of the buffed oxide layer is partly practiced on the buried oxide layer region except the above-shield mask regions by practicing the high-temperature oxidation treatment over 1150° C. in the oxygen atmosphere, the top silicon layer can be designed to form the source or the drain on part of the top silicon layer under regions except the above-shield mask regions.

By the thus design, in addition to control the thickness of the buried oxide layer corresponding to each device by the high-temperature oxidation processing adjusted to the different breakdown voltages of each device by means of the local growth of the buried oxide layer, if the thickness of the buried oxide layer corresponding to the source and drain in the devices is controlled in the devices, the devices having the different breakdown voltages can be integrated in mixture on the same substrate and, in particular, disadvantages in the low-voltage devices which are the decrease of parasitic capacitances and the negative electrical resistance property will be suppressed.

Consequently, according to the present invention, on condition that the buried oxide layer is formed in the SIMOX substrate by means of the anneal processing after the oxygen ion implantation, since a mask pattern is formed to shield the specified regions of the devices formed on the such SIMOX substrate from oxidation and the high-temperature oxidation treatment is also practiced, the thickness of the buffed oxide layer can be increased until the thickness required partly in each region except the specified regions. Furthermore, since the source or the drain regions are formed on other regions except the oxidation shield regions to form MOSFET, the conventional disadvantages which are a decrease of an active speed based on the parasitic capacitance, a decrease of the drain electric current by the negative electrical resistance can be suppressed.

According to other design, when the devices having different breakdown voltages are formed in the top silicon layer on the buffed oxide layer of the SIMOX substrate, the mask-pattern is formed on the top silicon layer to shield the regions corresponding to the low-voltage devices from the high-temperature oxidation by the mask and the buried oxide layer having the different thicknesses corresponding to each device is formed by the high-temperature oxidation. Since plural devices having the different breakdown voltages are formed on the thus buffed oxide layer, the oxygen ion implantation producing apprehensively dislocation in the single-crystal silicon layer is not practiced, but the mixed integration of the devices having different breakdown voltage can be carried out on one substrate of the same SIMOX substrate.

The mixed integration type semiconductor device improved in the disadvantages about the parasitic capacitance or the electrical resistance can be produced by controlling the thicknesses of the buried oxide layer corresponding to each specified region in respective devices after controlling the thicknesses of the buried oxide layer corresponding to each device.

The concrete embodiments of the producing method for the semiconductor device according to the present invention will be explained with reference to the drawings.

Figure 1:
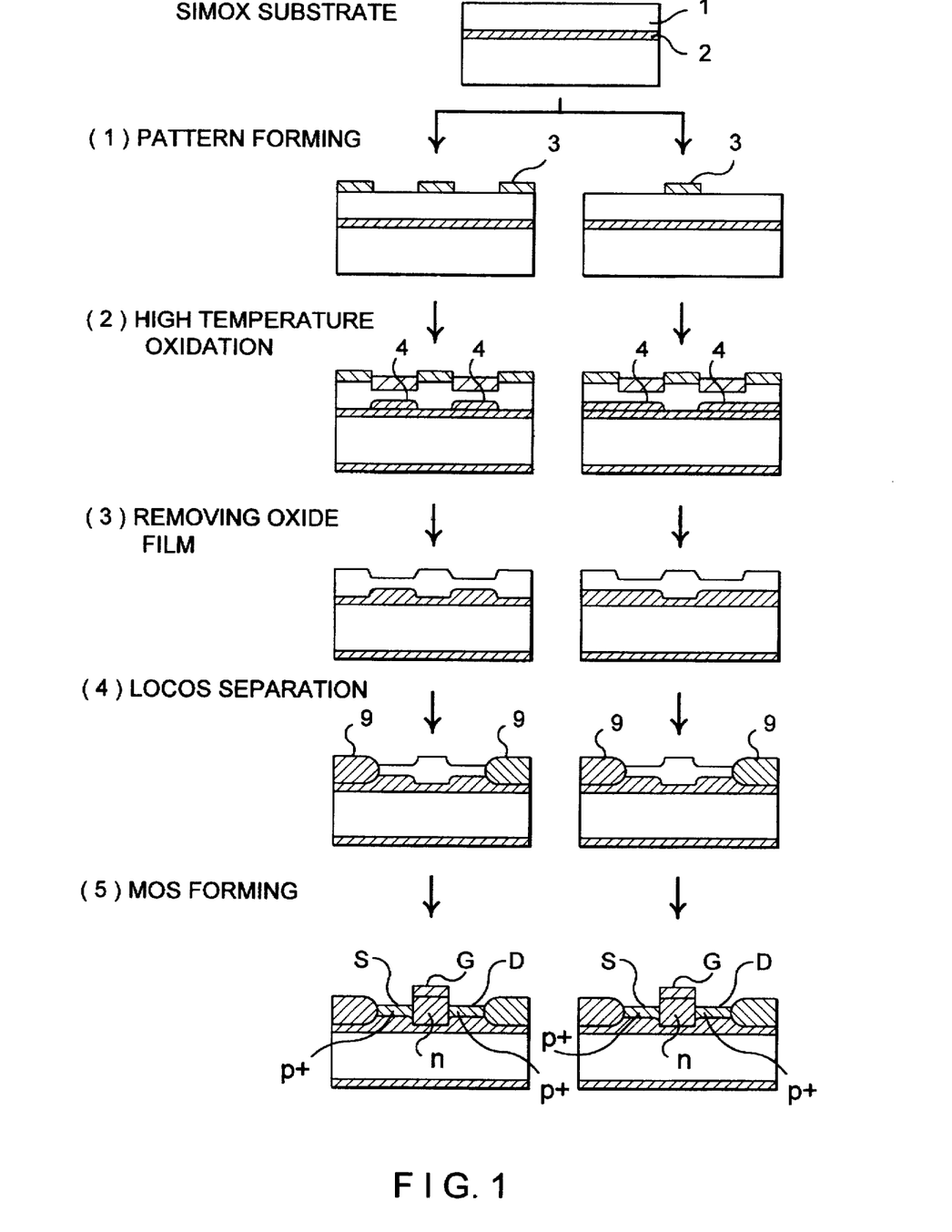
FIG. 1 is a schematic diagram of the producing process of the device by controlling the thickness of the buried oxide layer corresponding to each source and drain of the device according to the embodiment of the present invention.

FIG. 1 shows a process of producing the MOSFET on the SIMOX substrate as a starting point substrate with two instances of the producing process.

First, the SIMOX substrate 1 as the starting point substrate is fabricated by means of the well-known oxygen ion implantation. The implantation condition is defined as an accelerated energy of 180 keV and a dose of $4\times10^{17}/cm^2$. Therefore, the implanted oxygen atoms is distributed in a Gaussian distribution around the depth of about 430 nm from the surface of the substrate. There are compound Si-O with an unstable combining state besides $SiO_2$ in the substrate after the ion implantation.

Next, the anneal processing is practiced in order to form a buffed oxide layer 2 designed from $SiO_2$ with chemical stable state to practice the dielectric separation of the top silicon layer from the substrate silicon by steepening the interface of a distributing area formed by the oxygen ion implantation. The above anneal processing is that the substrate is processed under an atmosphere containing therein Ar gas as inert gas having at a flow rate of 0.5% $O_2$, practicing a heat treatment at 1350° C. for four hours. The top substrate is prevented from producing pits thereon by adding 0.5% $O_2$ into the atmosphere gas. As a result, a buffed oxide layer with chemical stable state is formed by combining the implanted oxygen ions with the silicon, so that the interfaces of the buffed oxide layer 2 become abrupt at the predetermined depths. The depth which the buried oxide layer 2 is formed is optionally adjusted by changing the acceleration energy of the oxygen ions.

MOS devices are formed to the thus-formed SIMOX substrate and, in the case of the pMOS used in an inverter, the thickness of the buffed oxide layer corresponding to a source S and a drain D is selectively increased in the pMOS in the embodiment of FIG. 1 to remain the part of the buried oxide layer positioned right under a gate G in the thickness in producing the SIMOX substrate.

In a process shown in the left side of FIG. 1, a mask-pattern 3 is formed on the top of the SIMOX substrate 3 (process (1)). The mask-pattern 3 works in order to practice the local growth of the buried oxide layer 2 corresponding to the regions of the source S and the drain D as the specified regions to decrease the parasitic capacitance and to mask the top silicon layer except the S and D from the oxidation. The mask-pattern 3 may be formed with the general pattern forming method by thermal oxide oxidation below 1100° C.

The local growth of the buried oxide layer 2 corresponding to the specified electrode S and D is practiced by the high-temperature oxidation of the substrate 1 with the above-formed mask-pattern 3. This means that the substrate 1 is processed to remain in a heat furnace under the oxidation atmosphere containing residual Ar gas having $O_2$ concentration 70% and to practice the oxidation treatment in the state of heating up at 1350° C. for four hours (process (2)). Therefore, areas 4 are formed where the buffed oxide layer 2 corresponding to the electrode S and D except parts shielded by the mask-pattern 3 grows.

The surface oxide film and the mask-pattern 3 are removed from the substrate (process (3)) and MOSFET is formed with a general method. In addition to practice LOCOS separation to insulate between MOSFET devices (process (4)), MOSFET is formed by forming the source and the drain on the areas 4, forming p-type or n-type layer with doping impurity to an active silicon, and setting electrodes (process (5)).

A process shown in the right side of FIG. 1 is that the growth of the buried oxide layer including the LOCOS film part to separate between MOSFET devices is practiced to shield particularly the part corresponding to the gate electrode G exerting no influence on the parasitic capacitance by the mask-pattern 3 from oxidation and other things are the same as the afore-mentioned example.

Incidentally, in the substrate in the process (3) of FIG. 1, when the irregularity quantity of the surface of the substrate is required to decrease, for instance, the only mask 3 is selectively removed after the high-temperature oxidation treatment of the process (2) (e.g., when mask material is a silicon nitride film, it is removed by phosphoric acid solution), and the low-temperature oxidation below 1150° C. is practiced. In this case, the top silicon layer corresponding to the regions removing from the mask 3 is primarily oxidized, so that the irregularity of the surface of the substrate after the oxide film is removed in the later process (3) can be fewer.

Figure 3:
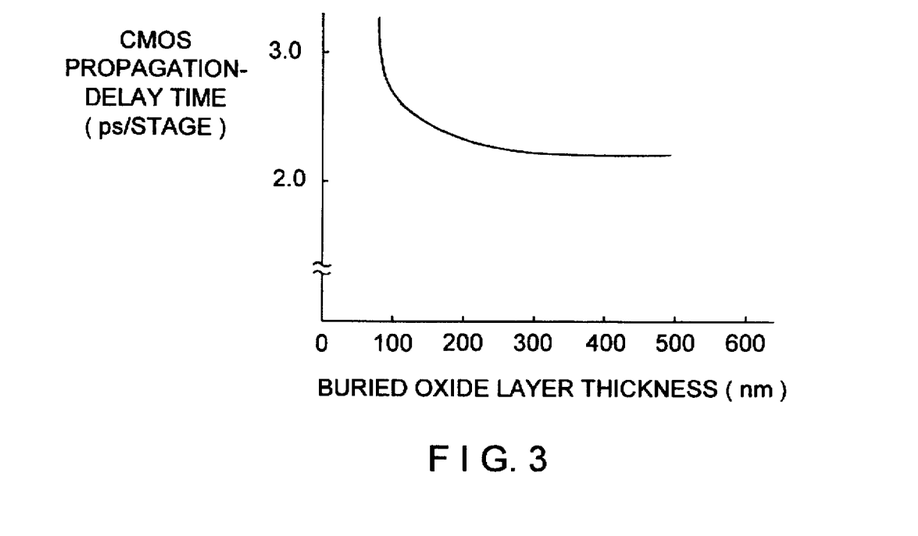
FIG. 3 is a correlative chart of the thickness of the buried oxide layer and the propagation-delay time in CMOS·LSI.

FIG. 3 shows a correlativeness of the thickness of the buffed oxide layer of CMOS·LSI having an SOI structure and propagation-delay time. And FIG. 3 shows a result in the case of the applied voltage 2.5 V, the thickness 10 nm of the gate oxide film, the gate length 2.5 μm. The propagation-delay time in CMOS·LSI has been 22 ps in the thickness 450 nm of the buffed oxide layer and has increased 30 ps in the thickness 90 nm of the buried oxide layer and the performance has been inferior. However, in CMOS·LSI according to the first embodiment in which the thickness of the buffed oxide layer corresponding to the source S, the drain D shown in FIG. 1 is defined as 110 nm, the propagation-delay time is shortened to 26 ps. This means that the propagation-delay time can be improved by the decrease of the parasitic capacitance of the source and the drain.

Figure 4:
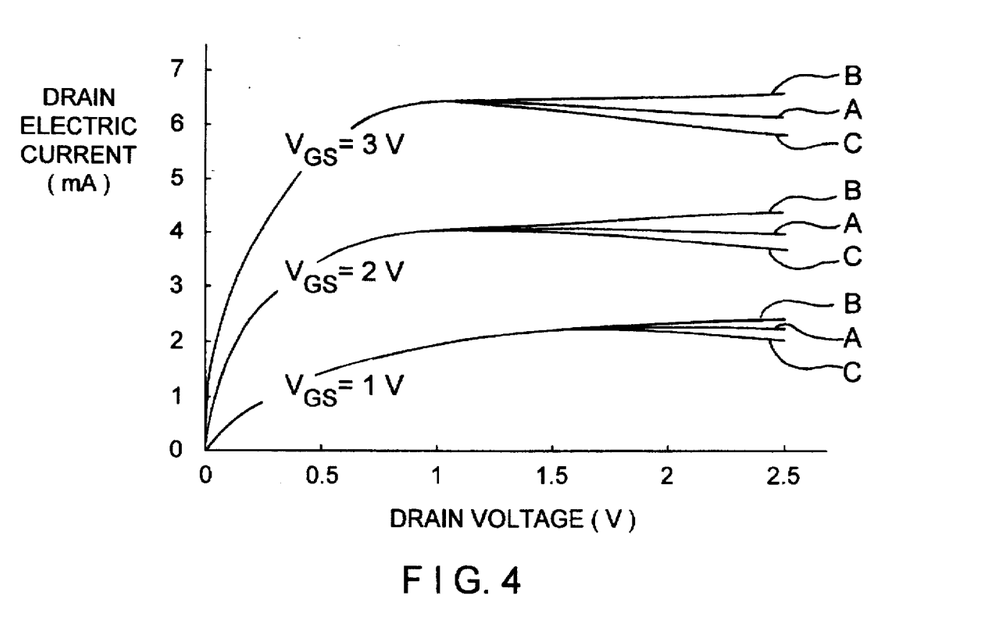
FIG. 4 is a correlative chart of the drain voltage and the drain electric current in MOSFET.

FIG. 4 shows a correlativeness of a drain voltage and a drain electric current in the case of changing the gate voltage $V_{GS}$ to 3 V, 2 V and 1 V. In the figure, the reference symbol A means when the thickness of the buried oxide layer right under the MOS device is uniformly defined as t=110 nm, the reference symbol B means when, in the MOS device formed by the first embodiment, the thickness of the buffed oxide layer right under the source and drain is defined as t=110 nm and the thickness of the buried oxide layer right under the gate is defined as t=90 nm, and the reference symbol C means t=450 nm in the conventional method. In the example C according to the conventional method, saturated drain electric current reduces by about 10%. However, in the producing method according to the present invention, the average thickness of the buried oxide layer between the device and the substrate silicon can be thin, and an effect on suppressing the reduction of the drain electric current caused by the negative electrical resistance is confirmed.

Incidentally, the example of producing the pMOS in the afore-mentioned embodiment is described, and in producing the nMOS, there are the disadvantage of the parasitic capacitance in the drain electrode parts, so that the buried oxide layer corresponding to the thus drain electrode parts may be partly grown to solve.

Figure 2:
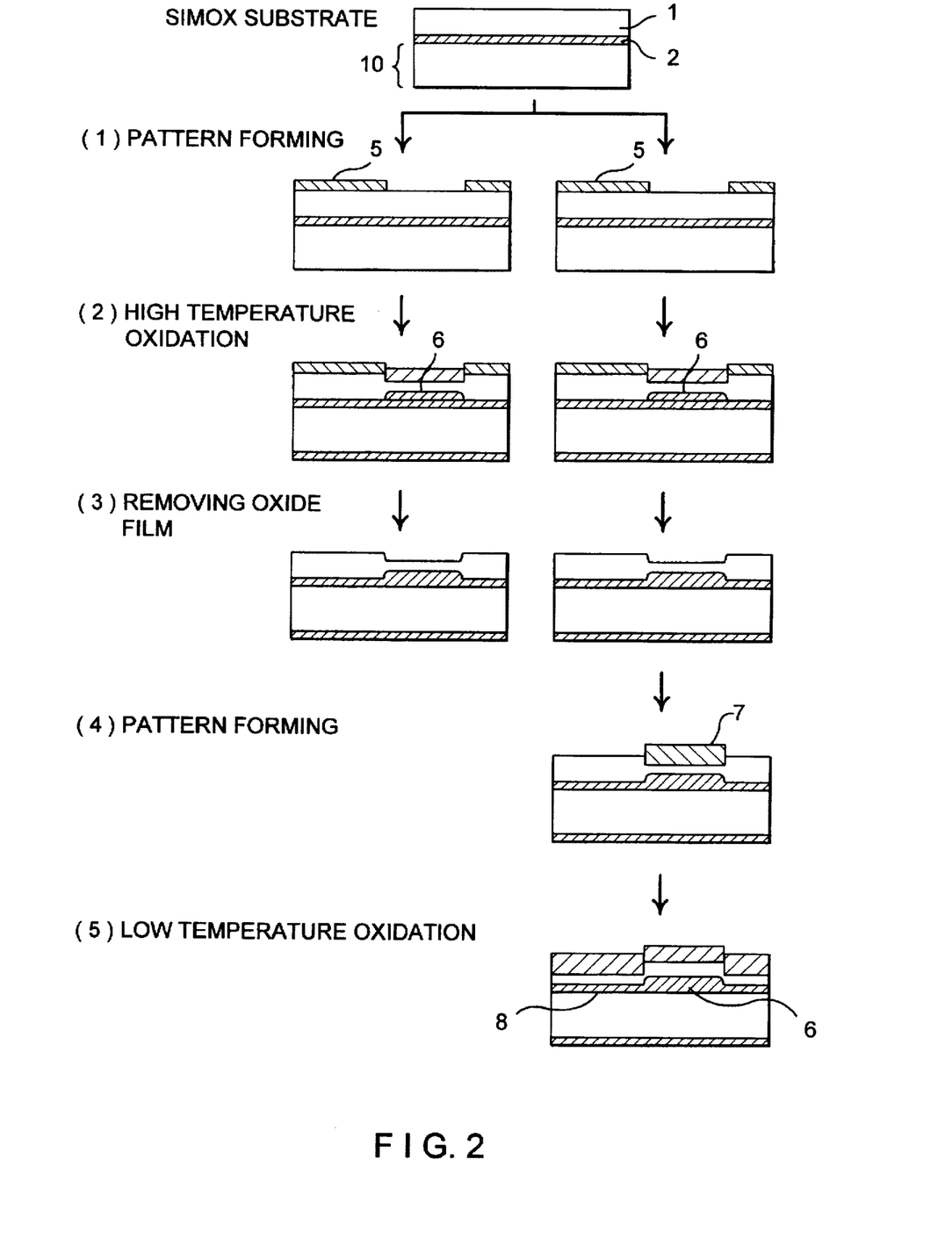
FIG. 2 is a schematic diagram of the producing process of the device by controlling the thickness of the buried oxide layer corresponding to the devices having different breakdown voltages according to the embodiment of the present invention.

The reduction of the drain electric current caused by the negative electrical resistance or the parasitic capacitance as the disadvantages in the source or drain in the MOS devices is designed to be improved in the thus far described embodiment. Next, other production process example of an embodiment to be able to form devices having different breakdown voltages on the same substrate in mixture is shown in FIG. 2. The starting point substrate 1 in the above embodiment as well as the embodiment in FIG. 1 is processed through the anneal processing by means of the heat treatment at 1350° C. for four hours under an atmosphere containing therein Ar gas +0.5% $O_2$ after the oxygen ion implantation is carried out under the conditions of acceleration voltage 180 keV, dose of ions $4 \times 10^{17}$/cm².

In the thus substrate as the starting point substrate, it is designed that the growth of the buried oxide layer is practiced on the partial buried oxide layer 2 corresponding to a high-voltage device part requiring the thick dielectric separation film by dividing the region to form the high-voltage devices from the region to form low-voltage devices.

In a process of the left side of FIG. 2, a first mask-pattern 5 is formed on the SIMOX substrate 1 to prevent the top silicon region except the region to form high-voltage devices from oxidizing (process (1)). The mask may be formed with a general thermal oxide film.

The buried oxide layer 2 corresponding to only the region to form high-voltage devices is partly grown by practicing the high temperature oxidation of the substrate 1 having the mask-pattern 5. This means that the substrate 1 is processed to remain in the heat furnace under the oxidation atmosphere containing therein residual Ar gas having concentration $O_2$ 70% and to practice the oxidation treatment in the state of heating up at 1350° C. for four hours (process (2)). Therefore, an area 6 is formed by practicing the thickness increase in the part of the buried oxide layer 2 corresponding to the region where the high-voltage devices are formed, where the mask-pattern 5 does not shield.

Next, the mask-pattern 5 and the top oxide film are removed with etching from the substrate (process (3)), and after the top silicon layer is divided into several parts on the buried oxide layer 2 by LOCOS isolation, the high-voltage devices (e.g., IGBT) are formed on the area 6 corresponding to the buried oxide layer which has been grown and the low-voltage devices (e.g., MOS-LOGIC) are formed at places except the area 6. The above-described devices may be formed by a well-known method (non-shown).

In a process shown in the right side of FIG. 2, after forming the first mask-pattern 5 on the top of the SIMOX substrate, the substrate is processed through the high temperature oxidation under the predetermined $O_2$ concentration atmosphere at temperatures of between 1150° C. and less than the melting point temperature for silicon for several hours, so that the area 6 corresponding to the increased buried oxide layer 2 can be formed. The next process is that the oxide film and the mask-pattern 5 are removed from the substrate and, in a further process, after forming a second mask-pattern 7 on the top of the SIMOX substrate 1, the substrate is processed through the low-temperature oxidation below 1150° C., the thickness of the top silicon layer is adjusted to requiring thickness and an area 8 is formed. At the end, the high-voltage devices are formed on the area 6 and the low-voltage devices are formed on the area 8. Incidentally, after forming the area 6 and removing the oxide film from the surface of the substrate, the thickness of the partial area 6 may be further increased by heating under the predetermined $O_2$ concentration atmosphere at temperatures of between 1150° C. and less than the melting point temperature for several hours again.

Conventionally, there have been two types of SIMOX substrates produced by the oxygen ion implantation. One is applied to high-voltage devices and the other is applied to low-voltage devices. The thickness of the buried oxide layer of the SIMOX substrate to form the high-voltage devices is defined as 450 nm and the thickness of the buried oxide layer of the SIMOX substrate to form the low-voltage devices is defined as 90 nm. However, by applying the producing method for MOS-LSI according to the present invention based on the SIMOX substrate having the thickness 90 nm of the buried oxide layer, the thickness of the partial buried oxide layer can be increased to 400 nm and both of the high-voltage devices and the low-voltage devices can be formed together on one substrate formed by the oxygen ion implantation method.

Incidentally, there is other non-shown design to be able to eliminate simultaneously the disadvantages causing, in particular, the parasitic capacitance or the negative electrical resistance in each source and drain of the low-voltage devices by the way in which the substrate is processed through the processes shown in FIG. 1 after controlling the thicknesses of the buried oxide layer corresponding to each region to form devices having different breakdown voltages in the producing method shown in FIG. 2. When the substrate having in the thickness of the buried oxide layer controlled by means of the high-temperature oxidation treatment as shown in FIG. 2 is defined as the starting point substrate and next the process treatments as shown in FIG. 1 are carried out therein, the thus design is easily achieved.

What is claimed is:

1. A method of producing a semiconductor device on a SIMOX substrate having a buried oxide layer dielectrically separating a top silicon layer from a substrate silicon, comprising the steps of:

forming an oxidation shield mask on regions of the top silicon layer of the SIMOX substrate corresponding to one or plural semiconductor devices;

growing a thickened part of the buried layer in regions not shielded by the mask by heating the SIMOX substrate under an oxygen atmosphere to at least about 1,150° C.; and forming a source or drain in the top silicon layer on the thickened part of the buried oxide layer.

2. A method of producing a semiconductor devices of high and low voltage on a single SIMOX substrate having a buried oxide layer dielectrically separating a top silicon layer from a substrate silicon, comprising the steps of:

forming an oxidation shield mask on the region of the top silicon layer on which a low voltage semiconductor device is desired;

growing a thickened part of the buried oxide layer in regions not shielded by the mask by heating the SIMOX substrate under an oxygen atmosphere to at least about 1,150° C.; and forming semiconductor devices having different breakdown voltages on the top silicon layer with a high-voltage device located over the thickened part of the buried oxide layer and the low-voltage device located over the unthickened portion of the buried oxide layer.

3. A method of producing semiconductor devices according to claim 2, wherein the step of forming semiconductor devices of different breakdown voltages comprises the steps of:

removing the oxidation shield mask;

forming an additional oxidation shield mask on the top silicon layer of the SIMOX substrate corresponding to semiconductor devices;

thickening the buried oxide layer in regions not shielded by the additional mask by an additional heating of the SIMOX substrate under an oxygen atmosphere to at least about 1,150° C.; and forming in the top silicon layer a source or a drain located over a portion of the buried oxide layer which was thickened in the additional heating.

4. A method of producing semiconductor devices according to claim 1, wherein the semiconductor devices are nMOS semiconductor devices; and wherein a portion of the top silicon layer not shielded by the mask is the drain.

5. A method of producing semiconductor devices according to claim 1, wherein the semiconductor devices are pMOS semiconductor devices; and wherein a portion of the top silicon layer which is not shielded by the mask is both the drain and the source.

* * * * *